Jan. 21, 1964 R. L. WATTERS 3,119,080

SEMICONDUCTOR ATTENUATING CIRCUIT

Filed Nov. 2, 1960

Inventor:
Robert L. Watters,
by Joseph V. Claeys
His Attorney.

United States Patent Office 3,119,080
Patented Jan. 21, 1964

3,119,080

SEMICONDUCTOR ATTENUATING CIRCUIT

Robert L. Watters, Schenectady, N.Y., assignor to General Electric Company, a corporation of New York Filed Nov. 2, 1960, Ser. No. 66,768
9 Claims. (Cl. 332—52)

Figure 1:
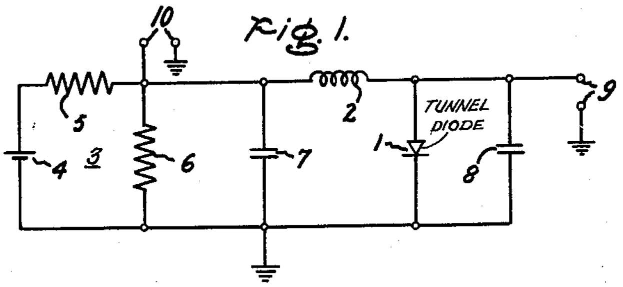

This invention relates to a voltage sensitive attenuating circuit and in particular to such a circuit utilizing semiconductor devices. As used throughout the specification and in the appended claims the term "attenuating circuit" is used in a broad sense and is intended to include a circuit capable of providing an increase as well as a decrease in the intensity of energy as, for example, radio waves. Such action is often more commonly referred to in the art as "negative" and "positive" attenuation respectively.

While this invention is subject to a wide range of applications, it is especially suited for providing a reliable and inexpensive automatic gain control system and will be particularly described in one embodiment in that connection. In many amplifier applications it is required to maintain a nearly constant output over a wide range of input signal voltages. For example, almost all receivers of amplitude modulated signals of the superheterodyne type are provided with some type of automatic gain control system to maintain the carrier voltage at the second detector approximately constant. In conventional vacuum tube circuits this is usually accomplished by biasing the control electrodes of the vacuum tubes in the R-F, I-F and mixer sections of the receiver with a direct current voltage normally derived from the usual diode detector. This voltage is proportional to the amplitude of the carrier at the diode detector input terminals and free of modulation. An increase in the signal increases the bias which tends to counteract the increased signal by reducing the amplification of the respective sections of the receiver and vice versa.

Such a system is not ideal but, by means of such expedients as delaying the action of the automatic gain control system so no control is exerted on weak signals, amplifying the automatic gain control effect and controlling the gain of many vacuum tubes, quite satisfactory operation has been obtained with conventional vacuum tube circuits. Such systems, however, have not been successfully employed to provide satisfactory automatic gain control for amplifier circuits utilizing semiconductor devices, such as transistors, as the active circuit elements therein. For example, with such transistor amplifier circuits for operation over a wide range of input signal voltages satisfactory automatic gain control is extremely difficult to provide and is usually not achieved without including additional nonlinear control elements and associated circuitry. The additional nonlinear control elements, however, increase the complexity of the system and, in addition, may introduce undesired limitations in the maximum operating frequency of the amplifier. Moreover, such prior art systems are capable of exerting only a limited range of control and are, therefore, far from ideal, especially when the amplifier system is required to maintain a nearly constant output over an extremely wide range of input signal voltages.

It is an object of this invention, therefore, to provide a voltage sensitive attenuating circuit capable of providing effective automatic gain control for an amplifier system operating over a wide range of input signal voltages and which avoids one or more of the disadvantages of the prior art systems.

It is another object of this invention to provide a voltage sensitive attenuating circuit capable of amplitude modulating a selected input signal.

It is another object of this invention to provide a circuit capable of providing automatic gain control for an amplifier system operating over a wide range of input signal voltages which is reliable, provides a wide range of control and requires fewer circuit components and less complex circuitry than any prior art automatic gain control system.

It is another object of this invention to provide a voltage sensitive attenuating circuit for accomplishing automatic gain and selectivity control.

It is still another object of this invention to provide a voltage sensitive attenuating circuit requiring a minimum of circuitry and utilizing a single active circuit element.

Briefly stated, in accordance with one aspect of this invention a voltage sensitive attenuating circuit comprises a tunnel diode device exhibiting a negative resistance region in the low forward voltage range of its current-voltage characteristic and bias means in circuit therewith establishing a direct current load line having a single intersection with the diode current-voltage characteristic. Means are provided for impressing a selected input signal on the tunnel diode. A frequency selective load, having its highest impedance at the frequency of the selected input signal, is connected in circuit with the tunnel diode device, the highest impedance of the frequency selective load being less than the absolute value of the diode negative resistance. Means are further provided for coupling a control signal to the diode for varying the bias thereon and the gain of the circuit in response to this control signal. When utilized to provide automatic gain control in a receiver of amplitude modulated signals, for example, the voltage sensitive attenuating circuit may replace one of the conventional amplifier stages of the amplifier system, the control signal is derived from the usual diode detector in a conventional manner and coupled to the tunnel diode to vary the bias thereon and the gain of the amplifier system. By appropriate selection of the "Q" of the frequency selective load the circuit simultaneously provides a variation in the bandwidth to vary the selectivity of the amplifier system as well as the gain.

In another embodiment of the present invention a control signal may be provided which varies at a rate less than that of the selected input signal. This control signal varies the bias and the gain of the circuit in the manner set forth hereinbefore resulting in an amplitude modulation of the selected input signal by the varying control signal.

Figure 2:
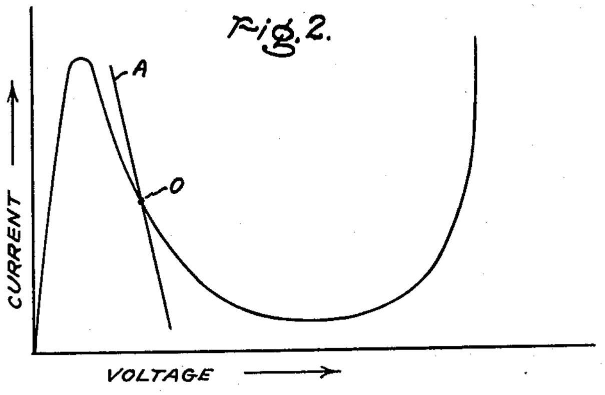
Figures 3, 4:
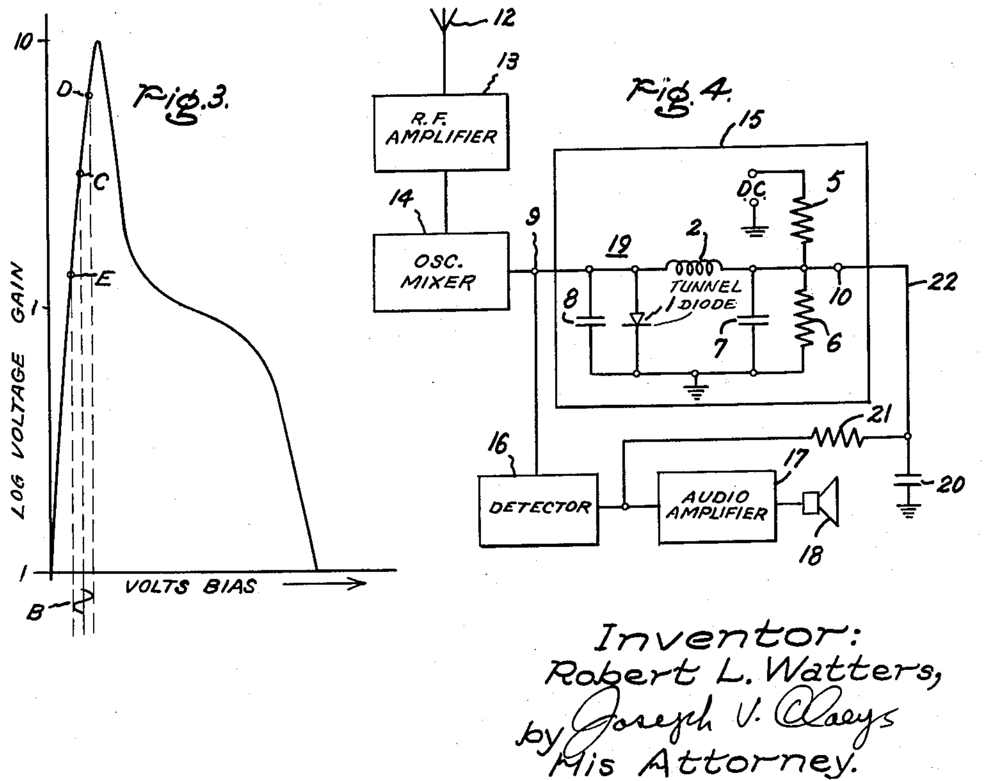

The features of my invention which I believe to be novel are set forth with particularity in the appended claims. My invention itself, however, both as to its organization and method of operation, together with further objects and advantages thereof, may best be understood by reference to the following description taken in connection with the accompanying drawing in which:

FIG. 1 is a schematic diagram of the basic voltage sensitive attenuating circuit of this invention, FIG. 2 is a current-voltage characteristic of a typical tunnel diode device utilized in the practice of this invention illustrating a suitable direct current load line, FIG. 3 is a curve illustrating the gain of the circuit of FIG. 1 is a function of the bias on the tunnel diode, and, FIG. 4 is a circuit diagram partly schematic of a complete modulated-carrier signal receiver of the superheterodyne type embodying the present invention.

The active circuit element utilized in the practice of this invention is of the type now often referred to in the art as a "tunnel diode device." Tunnel diodes are two-terminal devices comprising a space charge region less than 200 angstrom units wide such that the current-voltage characteristic of the device is determined primarily by the quantum mechanical tunneling process. For example, one widely known semiconductor type tunnel diode device comprises a P-N junction region formed between degenerate P-type conductivity and degenerate N-type conductivity semiconductive material. Such a device has a narrow junction space charge region, less than 200 angstrom units wide, and exhibits a negative resistance region in the low forward voltage range of its current-voltage characteristic.

Although the tunnel diode device described above is the most widely known at present, tunneling effects have been observed in metal-insulator-metal devices, devices comprising a narrow P-N junction formed between two dissimilar semiconductive materials and other constructions. As used throughout the specification and in the appended claims, therefore, the term "tunnel diode device" refers to a device comprising a narrow space charge region, less than 200 angstrom units wide, such that the current-voltage characteristic of the device is determined primarily by the quantum mechanical tunneling process.

The use of the term "degenerate" in a semiconductor device is intended to denominate a body or region of semi-conductive material which, if N-type, has substantially all of the states near the bottom of the condition band occupied by electrons as shown on a Fermi-level diagram for that semiconductive material. Similarly, if the semiconductive material is P-type the term "degenerate" refers to a body or region wherein substantially all of the states in an appreciable region near the top of the valence band are emptied of electrons. The "Fermi-level" in such energy level diagrams is the level at which the probability of finding an electron in a particular state is equal to one half. Typical energy level diagrams for semiconductive materials may be found on pages 78, 87, 90, 142, 164 and 165 of the text entitled "Introduction to Semiconductors" by W. Crawford Dunlap, Jr., published in 1957, by John Wiley and Sons, Inc., New York.

The forward voltage range wherein the negative resistance region appears in such a tunnel diode device varies depending upon the semiconductive material from which the device is fabricated. For example, the range of the negative resistance region of typical tunnel diodes is from about 0.04 to 0.3 volt for germanium, about 0.08 to 0.4 volt for silicon and about 0.15 to 0.6 volt for gallium arsenide.

For further details concerning the tunnel diode devices utilized in the practice of this invention reference may be had to the copending application of J. J. Tiemann, Serial No. 858,995, filed December 11, 1959, now abandoned, and assigned to the assignee of the present invention, and to the booklet entitled "Tunnel Diodes" published in November 1959 by Research Information Services, General Electric Company, Schenectady, New York. The aforementioned application was abandoned in favor of the continuation-in-part application of Tiemann, Serial No. 74,815, filed December 9, 1960, assigned to the assignee of the present application, and disclosing and claiming the subject matter of the parent application.

In FIG. 1 there is shown a schematic circuit diagram of the basic voltage sensitive attenuating circuit of this invention. Tunnel diode 1 is connected through inductance 2 to a suitable direct current bias means generally indicated at 3. Bias means 3 may take any convenient form and is shown as battery 4 and resistances 5 and 6. The values of battery 4 and resistances 5 and 6 are selected to establish a direct current load line which always has only a single intersection with the tunnel diode current-voltage characteristic. A direct current load line having a suitable slope to satisfy this requirement is shown at A in FIG. 2. In the bias arrangement indicated at 3 in FIG. 1 the slope of the direct current load line is determined primarily by the value of resistance 6.

To prevent the flow of alternating current to bias means 3, by-pass capacitance 7 is connected across resistance 6. Capacitance 8 is connected across tunnel diode 1 and forms a frequency selective load therefor with inductance 2. Common input-output terminals 9—9 provide means for impressing a selected signal on the tunnel diode 1 and for obtaining an output therefrom. The frequency selective load, by suitable selection of inductance 2 and capacitance 8, provides its highest impedance across tunnel diode 1 at the frequency of the selected input signal. The highest impedance of the frequency selective load is chosen to be less than the absolute value of the tunnel diode negative resistance. Usually this is assured by suitable selection of the tunnel diode device having a particular value of negative resistance, although an additional resistance may be provided in the circuit if desired. A selected control signal is coupled to diode 1 at terminals 10—10 to vary the tunnel diode bias in response thereto.

The circuit just described may be used to provide a wide range of control of the amplitude of a selected input signal impressed on tunnel diode 1 at input-output terminals 9—9 by action of the variation in the tunnel diode bias due to action of the control signal applied to terminals 10—10. This variation in amplitude of the input signal in response to the variation of diode bias may be shown particularly by the graph of FIG. 3 illustrating the gain of the circuit with respect to the bias on the tunnel diode. From FIG. 3 it is apparent that the basic circuit of this invention provides an increase as well as a decrease in the intensity of a signal impressed thereon.

One mode of operation of the voltage sensitive attenuating circuit of this invention may best be shown by reference to FIG. 4 of the drawing. In FIG. 4 there is shown a circuit diagram, partly in schematic, of a complete modulated-carrier signal receiver of the superheterodyne type embodying this invention. This receiver comprises, in cascade, an antenna circuit 12, a radio-frequency amplifier 13, a local oscillator and mixer 14, an intermediate-frequency section 15, a detector 16, an audio-frequency amplifier 17, which may include any desired number of stages, and a sound reproducer or speaker 18. Intermediate-frequency section 15 may include one or more stages, however, for simplicity of description this section is shown having only the single stage 19 which is the voltage sensitive attenuating circuit of this invention. With the exception of the voltage sensitive attenuating circuit 19, all of the other components of the superheterodyne receiver may be of any suitable conventional construction.

Automatic gain control is provided by deriving, in conventional manner, a suitable control signal from detector 16. For example, the signal at the input terminals of the detector 16 may be rectified and passed through an integrating network, comprising capacitance 20 and resistance 21, to provide a unidirectional voltage which is proportional to the average amplitude of the carrier at the input terminals of detector 16. This voltage is applied over conductor 22 to terminal 10 of the voltage sensitive attenuating circuit 19.

In operation, the bias on tunnel diode 1 is adjusted to provide a maximum gain in the circuit 19 in the absence of an input signal at terminals 9—9. This may be accomplished, for example, by providing that the intersection with the diode current voltage characteristic is near the center of the negative resistance region thereof as shown by the load line A intersecting the diode current-voltage characteristic at the point 0 in FIG. 2. Under this condition the intersection is at the region of steepest slope of the negative resistance region. Reference to the gain-bias curve of FIG. 3 clearly illustrates the effect on the gain of circuit 19 in response to a variation in the tunnel diode bias. For example, an increase in the carrier signal from a given value produces a corresponding increase in the control signal derived from the detector 16 and applied to the tunnel diode at terminal 10. This control signal may be of a polarity with respect to tunnel diode 1 which results in either an increase or decrease in the bias on the diode. However, for purposes of this description the control signal will be designated as having a polarity which provides a decrease in the bias on tunnel diode 1 for an increase in the amplitude of the carrier. For any given amplitude of input signal the gain of circuit 19 is correspondingly less than its maximum possible gain in the absence of a signal. An increase in the amplitude of the carrier at detector 16, due to a stronger input signal, results in a decrease in the bias on tunnel diode 1 causing a lowering of the gain of circuit 19. This reduced gain tends to counteract the effect of the increased input signal, tending to maintain the signal voltage at detector 16 approximately constant. Similarly a weaker input signal produces a carrier at detector 16 of less amplitude resulting, by action of the control signal applied to terminal 10, in an increase in the tunnel diode bias and a corresponding increase in the gain of circuit 19.

By operation of the voltage sensitive attenuating circuit of this invention, therefore, large variations in the input signal result in only very small variations in the output making possible an automatic gain control system which provides approximately constant output from an amplifier system or receiver operating over a wide range of input signal voltages. In addition, by a suitable selection of the slope of the direct current load line significant amplification of the control signal may be provided. For example, establishing a direct current load line which in addition to having a single intersection with the diode current-voltage characteristic has a slope which is greater than, but approaches, the slope of the negative resistance region of the diode current-voltage characteristic. This may be conveniently accomplished in the circuit configuration shown in FIG. 1, for example, by making resistance 6 almost as large as the absolute value of the diode negative resistance.

In another specific application, the voltage sensitive attenuating circuit of this invention may be utilized to amplitude modulate a selected input signal. In the circuit of FIG. 1 an input signal impressed on terminals 9—9 is amplitude modulated by applying to terminals 10—10 a control signal which varies at a rate less than that of the selected input signal. For example, the control signal may vary at an audio rate and the input signal at terminals 9—9 may be a radio-frequency carrier. As described in detail hereinbefore and illustrated by FIG. 3 the gain of the voltage sensitive attenuating circuit of this invention is related to the bias on the tunnel diode device. The varying control signal, therefore, causes a time varying change in the gain of the circuit resulting in a corresponding change in the amplitude of the impressed signal. This action results in the amplitude modulation of the input signal by the varying control signal. As illustrated in FIG. 1 the circuit requires a minimum of circuit components and less complex circuitry than any known prior art means of providing such amplitude modulation.

Ordinarily, for application as a modulator, the tunnel diode is not biased to provide maximum gain as in the case of the automatic gain control. Since it is usually desirable that the modulator introduce as little distortion as possible, it is convenient to bias the tunnel diode to assure an output which is approximately a linear function of the bias. This may be shown by a particular example with reference to the gain-bias curve of FIG. 3. A control signal varying at a rate less than that of the selected input signal and designated for purposes of description as the wave B, is impressed on the terminals 10—10 of the basic circuit arrangement of FIG. 1. The tunnel diode may be biased in the absence of a control signal, for example, to provide a gain in the selected input signal applied to input-output terminals 9—9 shown by the point C. As the tunnel diode bias is varied in response to the control signal, the output of the circuit varies accordingly in the region D—E as illustrated in FIG. 3. Since this portion of the curve is quite linear the output has substantially a linear variation in response to the bias change. For example, as the amplitude of the control signal increases the amplitude of the output can be made to decrease and vice versa, thereby providing amplitude modulation of the input signal having the desired minimum of distortion. Alternatively, the tunnel diode may be biased to provide maximum gain in which case the amplitude of the output may be made to decrease with either an increase or a decrease in the bias produced by the varying control signal. Such a bias point results in a modulation having twice the frequency of the control signal which may be desirable for some applications.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A voltage sensitive attenuating circuit comprising: a tunnel diode exhibiting a negative resistance region in the low forward voltage range of its current-voltage characteristic; bias means coupled to said tunnel diode establishing a direct current load line therefor which has a single intersection with the diode current-voltage characteristic; means for impressing an input signal on said tunnel diode device; a frequency selective load effectively connected across said tunnel diode device at the input signal frequency and having its highest impedance value at the frequency of said input signal, said highest impedance value being less than the absolute value of the tunnel diode negative resistance; and means for coupling a control signal to said diode for varying the bias thereon and the gain of said circuit in response to said control signal.

2. The circuit of claim 1 wherein the frequency selective load connected across said tunnel diode device at said input signal frequency is a parallel combination of inductance and capacitance parallel resonant to the frequency of said input signal.

3. A voltage sensitive attenuating circuit comprising: a tunnel diode device exhibiting a negative resistance region in the low forward voltage range of its current-voltage characteristic; bias means coupled to said tunnel diode establishing a direct current load line therefor which has a single intersection with the diode current-voltage characteristic and a slope which approaches that of said negative resistance region; means for impressing an input signal on said tunnel diode device; a frequency selective load effectively connected across said tunnel diode device at the input signal frequency and having its highest impedance value at the frequency of said input signal, said highest impedance value being less than the absolute value of the tunnel diode negative resistance; and means for coupling a control signal to said tunnel diode for varying the bias thereon and the gain of said circuit in response to said control signal.

4. A voltage sensitive attenuating circuit comprising: a tunnel diode device exhibiting a negative resistance region in the low forward voltage range of its current-voltage characteristic; bias means coupled to said tunnel diode establishing a direct current load line therefore which has a single intersection with the tunnel diode current-voltage characteristic; means for impressing an input signal on said tunnel diode device; a frequency selective load effectively connected across said tunnel diode device at said input signal frequency and having its highest impedance value at the frequency of said input signal, said highest impedance value being less than the absolute value of the tunnel diode negative resistance; and means for coupling a control signal which varies at a rate less than that of said input signal to said tunnel diode varying the bias thereon and the gain of said circuit in response to said control signal causing said input signal to be amplitude modulated thereby.

5. A voltage sensitive attenuating circuit comprising: a tunnel diode device exhibiting a negative resistance region in the low forward voltage range of its current-voltage characteristic; means for impressing an input signal across said tunnel diode; bias means coupled to said tunnel diode establishing a direct current load line having a single intersection with said tunnel diode current-voltage characteristic and at a position thereon to provide maximum gain for said circuit in the absence of an input signal; a frequency selective load effectively connected across said tunnel diode device at the input signal frequency and having its highest impedance value at the frequency of said input signal, said highest impedance value being less than the absolute value of the negative resistance of said tunnel diode; and means for coupling a control signal to said tunnel diode for varying the bias thereon and the gain of said circuit in response to said control signal.

6. A voltage sensitive attenuating circuit comprising: a tunnel diode device exhibiting a negative resistance region in the low forward voltage range of its current-voltage characteristic; means for impressing an input signal across said tunnel diode; bias means coupled to said tunnel diode establishing a direct current load line having a single intersection with the tunnel diode current-voltage characteristic and at a position thereon to provide an output from said circuit which is approximately a linear function of the tunnel diode bias; a frequency selective load effectively connected across said tunnel diode device at the input signal frequency and having its highest impedance value at the frequency of said input signal, said highest impedance value being less than the absolute value of the negative resistance of said tunnel diode; and means for coupling a control signal to said tunnel diode for varying the bias thereon and the gain of said circuit in response thereto.

7. In combination as an amplifier stage in a receiver of carrier waves, an attenuating circuit exhibiting both positive and negative attenuation comprising: a tunnel diode device exhibiting a negative resistance region in the low forward voltage range of its current voltage characteristic; bias means coupled to said tunnel diode device establishing a direct current load line therefor having a slope which provides but a single intersection with said current-voltage characteristic, said intersection being near the center of said negative resistance region; means for impressing an input signal across said tunnel diode device; a frequency selective load having its highest impedance value at the frequency of said input signal and being effectively connected across said tunnel diode device at said frequency, said highest impedance value being less than the absolute value of the tunnel diode negative resistance; and means for coupling a control signal to said tunnel diode device for varying the bias thereon and a gain of said amplifier stage in response thereto, said control signal being derived from the incoming carrier wave.

8. The combination of claim 7 wherein said direct current load line established by said bias means has a slope which is greater than but approaches the slope of the negative resistance region of said tunnel diode current-voltage characteristic.

9. A voltage sensitive attenuating circuit comprising: a tunnel diode device exhibiting a negative resistance region in the low forward voltage range of its current-voltage characteristic; bias means coupled to said tunnel diode device establishing a direct current load line therefor which has a single intersection with said current-voltage characteristic; means for impressing a selected input signal across said tunnel diode device; a load impedance having a maximum value less than the absolute value of said tunnel diode negative resistance connected across said tunnel diode device; and means for coupling a control signal to said tunnel diode device for varying the bias thereon and the gain of said circuit.

References Cited in the file of this patent

UNITED STATES PATENTS

| | | |
|---|---|---|
| 2,808,474 | Maynard et al. | Oct. 1, 1957 |
| 2,923,816 | Schultz | Feb. 2, 1960 |
| 3,061,786 | Theriault | Oct. 30, 1962 |

OTHER REFERENCES

Electronics, "Recent Progress in Solid State Technology," pages 39–41, March 4, 1960.

Schultz: (RCA Technical Notes), June 1960, RCA TN. 383.

Notice of Adverse Decision in Interference

In Interference No. 94,374 involving Patent No. 3,119,080, R. L. Watters, SEMICONDUCTOR ATTENUATING CIRCUIT, final judgment adverse to the patentee was rendered Oct. 29, 1965, as to claim 9.

[*Official Gazette February 15, 1966.*]